(12) United States Patent
Skotnicki et al.

(10) Patent No.: US 6,989,570 B2
(45) Date of Patent: Jan. 24, 2006

(54) STRAINED-CHANNEL ISOLATED-GATE FIELD EFFECT TRANSISTOR, PROCESS FOR MAKING SAME AND RESULTING INTEGRATED CIRCUIT

(75) Inventors: Thomas Skotnicki, Crolles (FR); Daniel Bensahel, Grenoble (FR)

(73) Assignee: STMicroelectronics S.A., (FR)

( * ) Notice: Subject to any disclaimer, the term of this patent is extended or adjusted under 35 U.S.C. 154(b) by 16 days.

(21) Appl. No.: 10/405,075

(22) Filed: Mar. 31, 2003

(65) Prior Publication Data
US 2004/0188760 A1  Sep. 30, 2004

(30) Foreign Application Priority Data
Apr. 3, 2002 (FR) .................................. 02 04165

(51) Int. Cl.
*H01L 27/12* (2006.01)
(52) U.S. Cl. ...................... 257/347; 257/327; 257/616
(58) Field of Classification Search ................ 257/327, 257/347, 616
See application file for complete search history.

(56) References Cited

U.S. PATENT DOCUMENTS

| | | | |
|---|---|---|---|
| 6,326,667 B1 | 12/2001 | Sugiyama et al. | 257/347 |
| 6,515,335 B1 * | 2/2003 | Christiansen et al. | 257/347 |
| 6,537,894 B2 * | 3/2003 | Skotnicki et al. | 438/424 |
| 6,656,782 B2 * | 12/2003 | Skotnicki et al. | 438/221 |

FOREIGN PATENT DOCUMENTS

| | | |
|---|---|---|
| EP | 1 039 546 | 9/2000 |
| JP | 06120490 | 4/1994 |
| JP | 09321307 | 12/1997 |
| WO | WO 01/54202 | 7/2001 |

OTHER PUBLICATIONS

Skotnicki, et al., "Heavily doped and extremely shallow junctions on insulator— by SONCTION (SilicONCut-off juncTION) process"; *Electron Devices Meeting*, 1999, *IEDM Technical Digest*, International Washington, D.C. Dec. 5-8, 1999, Piscataway, New Jersey, *IEEE*, US, Dec. 5, 1999, pps. 513-516, XP010372064.

Maiti, et al., "Strained-Si heterostructure field effect transistors", *Semiconductor Science and Technology, Institute of Physics*, vol. 13, No. 11, London, GB, Nov. 1, 1998, XP000783138.

Thomas Skotnicki, Silicon On Nothing (SON)— Fabrication, Material and Devices, *Electrochemcial Society Proceedings*, vol. 2001, No. 3, Mar. 25-29, 2001; XP008014133.

Ribot, et al., "Selective SiGe epitaxy by rtcvd for new device architectures", *Materials Science and Engineering B*, Elsevier Sequoia, Lausanne, CH, vol. 89, No. 1-3, Feb. 14, 2002, pps. 125-128, XP004334382.

Anonymous, "MOS Transistors with Bottom-Isolated Source/Drain Regions", research disclosure, *Kenneth Mason Publications* Hampshire, GB, No. 398, dated Jun. 1, 1997, pps. 378-379, XP000726504.

French Search Report, FA 621699/FR 0204165, dated Feb. 24, 2003.

\* cited by examiner

*Primary Examiner*—Gene M. Munson
(74) *Attorney, Agent, or Firm*—Jenkens & Gilchrist, PC

(57) ABSTRACT

A transistor is located on a base layer 1 resting on a semiconductor substrate SB and formed from a relaxed silicon-germanium layer, and includes, under the isolated gate 7, a first strained silicon layer 2 resting on the base layer 1, surmounted by a buried insulating layer 10, surmounted by a second strained silicon layer 4 extending between the source S and drain D regions.

17 Claims, 4 Drawing Sheets

STRAINED-CHANNEL ISOLATED-GATE FIELD EFFECT TRANSISTOR, PROCESS FOR MAKING SAME AND RESULTING INTEGRATED CIRCUIT

PRIORITY CLAIM

The present application claims priority from French Application for Patent No. 02 04165 filed Apr. 3, 2002, the disclosure of which is incorporated by reference.

BACKGROUND OF THE INVENTION

1. Technical Field of the Invention

The present invention relates to integrated circuits and more particularly to isolated-gate field-effect transistors.

2. Description of Related Art

The development of CMOS technologies (isolated-gate field-effect complementary transistors) is currently facing several problems, the primary ones of which are the effects of short channels and the mobility of the carriers. It will be recalled here that a short channel, that is to say one having a very small distance (length) between the source and the drain, results in a reduction in the threshold voltage of the transistor, which may in the extreme case result in it being very difficult to control transistor operation.

At the present time, considerable research is going into the development of architectures that can remedy the problems of "short channel" effects and of carrier mobility. However, until now researchers have been confronted with incompatibility between the respective solutions to these two problems. This is because, under voltage, strained silicon channels provide carriers of greater mobility. However, once this type of channel has been produced in a transistor with a very short channel, it then becomes necessary for the channel to be highly doped so as to counteract the effects of short channels. But such doping inevitably reduces, or even eliminates, the gain in mobility intrinsically obtained by the use of a strained channel.

The present invention aims to provide a solution to this problem.

SUMMARY OF THE INVENTION

The present invention produces strained-channel transistors that are lightly doped. Thus, substantial carrier mobility and, at the same time, good control of the short channel effects are achievable in the case of very short transistors, for example those with gate lengths of around 30 to 50 nanometers, or even less.

The invention provides a process for fabricating an isolated-gate field-effect transistor, comprising:

the formation, on a silicon substrate, of a base layer formed from a relaxed silicon-germanium alloy;

the formation, on a part of the upper surface of the base layer, of a first strained silicon layer surmounted by a silicon-germanium interlayer, surmounted by a second strained silicon layer;

the formation, on the second strained layer, of the isolated gate of the transistor, the gate being flanked by isolating regions (spacers);

the etching of the said interlayer so as to form a tunnel under the isolated gate flanked by its isolating regions;

the filling of the tunnel with an insulating material; and then the formation of source and drain regions for the transistor.

This process makes it possible to obtain a second strained silicon layer in which the channel of the transistor is formed, the thickness of which layer is small. Thus, the "short channel" effects are controlled and minimized geometrically because of the architecture of the transistor which allows a thin channel layer to be obtained. This control is not achieved here by highly doping the channel region, which may remain lightly doped. Consequently, the increased carrier mobility obtained by the presence of strained silicon is preserved.

The thickness of the first strained silicon layer, the second strained silicon layer and the interlayer is much smaller than that of the base layer. To give an example, the thickness of the first strained silicon layer, the second strained silicon layer and the interlayer may be of the order of a few tens of nanometers, for example, 20 nanometers, whereas the thickness of the base layer is, for example, of the order of a few microns, typically 2 microns.

According to a first variant of the invention, the base layer, the first strained silicon layer, the second strained silicon layer and the interlayer are formed by non-selective epitaxy so as to form a stack. An isolation zone, for example of the shallow trench type, defining the said part of the upper surface of the base layer, is then formed in the stack and partly in the base layer, this being accomplished with a thermal budget compatible with non-relaxation of the strains in the strained silicon layers.

According to another variant of the invention, the base layer may be formed by non-selective epitaxy and then the isolation zone defining the said part of the upper surface of the base layer may be partly formed in the base layer. The first and second strained silicon layers and the interlayer are then advantageously formed by selective epitaxy on the said part of the upper surface of the base layer.

Such an implementation variant makes it possible to produce isolation zones with a higher thermal budget, since the strained silicon layers have at that time not yet been formed.

According to one method of implementing the invention, the formation of the tunnel comprises vertical etching of the second strained silicon layer, the interlayer and part of the first strained silicon layer, on each side of the isolated gate flanked by its isolating regions, so as to form recesses. Lateral selective etching of the rest of the interlayer is then carried out.

Moreover, the formation of the source and drain regions comprises the filling of the recesses by silicon epitaxy.

The subject of the invention is also an integrated circuit comprising an isolated-gate field-effect transistor of type described above and have a multiple strained silicon layer structure.

According to a general feature of the invention, the transistor is located on top of a base layer resting on a semiconductor substrate, this base layer being formed from a relaxed silicon-germanium alloy.

Moreover, the transistor comprises, under the isolated gate, a first strained silicon layer resting on the base layer, this first strained silicon layer being surmounted by a buried insulating layer, itself surmounted by a second strained silicon layer extending between source and drain regions.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
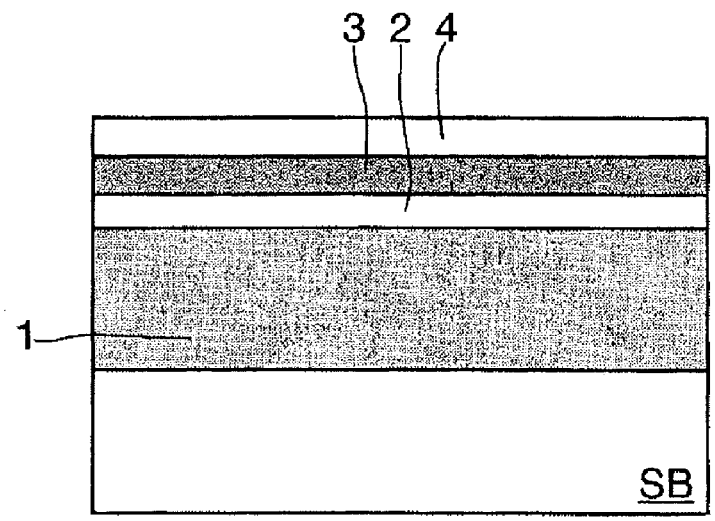
FIGS. 1 to 7 illustrate schematically the main steps of a method of implementing the invention, resulting in one embodiment of a transistor according to the invention.

In FIG. 1, the reference SB denotes a semiconductor substrate, for example made of silicon. A thick layer 1 formed from a silicon-germanium alloy is then grown by an epitaxy operation known per se. This epitaxy is carried out in a furnace in a silane/germane atmosphere.

Silicon-germanium has a lattice constant different from that of silicon. More specifically, the lattice constant of SiGe is larger than that of silicon. Consequently, when the silicon-germanium layer to be formed is thick, a dislocation is produced in the silicon-germanium, which then causes strain relaxation in the silicon-germanium. This occurs in the lower part of the base layer 1. Thereafter, beyond a certain thickness, single-crystal silicon-germanium starts to grow with its own crystal lattice, which is not strained, that is to say it is relaxed. This growth takes place with an increasing germanium concentration and then the epitaxy is completed with a constant germanium concentration so as to form, in the upper part of the base layer 1, a single-crystal silicon-germanium layer with a constant germanium concentration.

To give an example, the total thickness of the base layer 1 is around 2 microns.

The process then continues with the formation of a first strained silicon layer 2 on the upper surface of the base layer 1. This formation also takes place by an epitaxy operation known per se. This time, the thickness of the first layer 2 is small, for example around 20 nanometers. Consequently, there is lattice continuity between the silicon of the layer 2 and the silicon-germanium of the upper part of the base layer 1. Thus, the lattice constant of the silicon, which is intrinsically smaller than the lattice constant of the silicon-germanium alloy, will adjust to the silicon-germanium lattice and a silicon lattice will consequently expand, thereby introducing tensile strains into the layer 2.

The process then continues, again by non-selective epitaxy known per se, with the formation of an interlayer 3 formed from a silicon-germanium alloy. The silicon-germanium interlayer 3, which also has a small thickness, for example of around 20 nanometers, is not strained. This is because there will be continuity between the crystal lattice of the silicon-germanium and the expanded crystal lattice of the strained silicon of the layer 2.

A second strained silicon layer 4 is then formed, again by non-selective epitaxy, on the interlayer 3. The strains in the silicon layer 4 are obtained in a similar manner to the strains in the silicon layer 2. More specifically, the crystal lattice of the silicon will, by continuity, expand and adjust to the larger crystal lattice constant of the silicon-germanium of the interlayer 3. The thickness of the strained silicon layer 4 is also around 20 nanometers.

Figure 2:
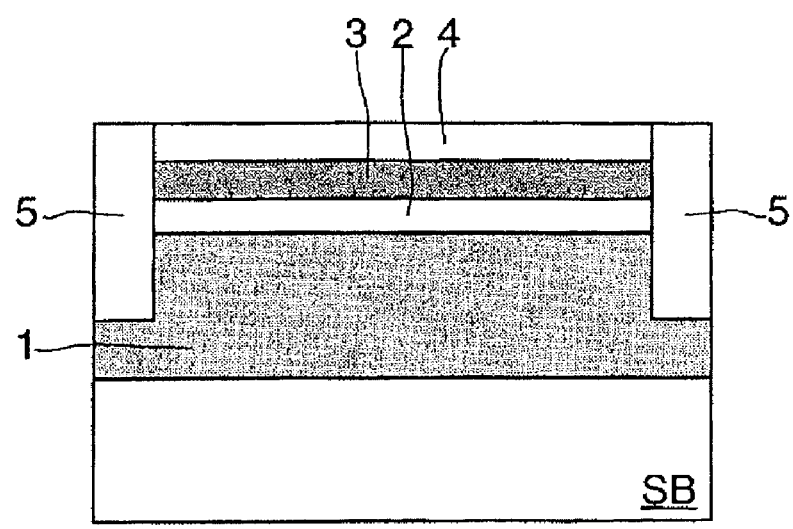

The process then continues (FIG. 2) with the formation of an isolation zone 5, for example of the shallow trench type. The steps to produce such an isolation zone, which in particular comprises etching the stack of the layers 2, 3 and 4 and partial etching of the base layer 1, are known to those skilled in the art. However, it is known that, above a certain temperature, strain relaxation occurs in the silicon. It is therefore advisable to produce the isolation zones 5 with a thermal budget compatible with non-relaxation of the strains in the strained silicon layers 2 and 4. To give an example, a temperature of around 900° C. is suitable.

Of course, any type of isolation zone, for example an isolation zone of the LOCOS type, a name well known to those skilled in the art, may be used provided that, however, it does not lead to relaxation of the strains in the strained silicon.

Figure 3:
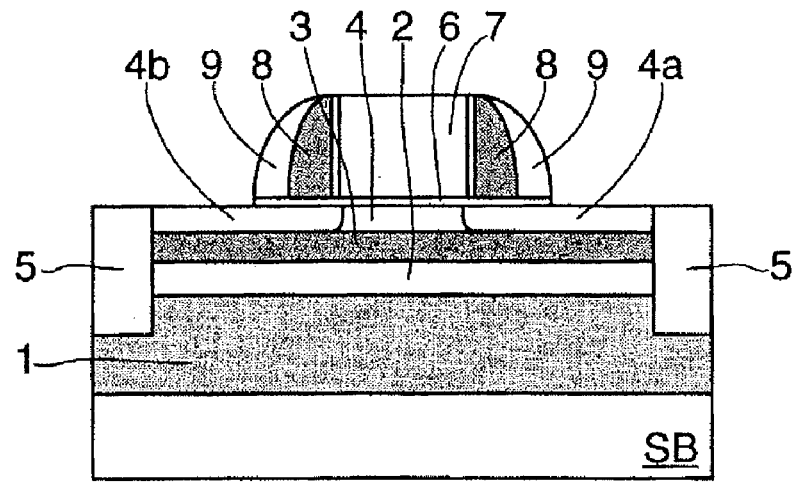

The process then continues (FIG. 3) with conventional production of the isolated gate of the MOS transistor. More specifically, this production first comprises the formation of a gate oxide 6 followed by the formation of the gate 7. The latter is flanked by isolating regions or spacers, formed in this case from a first type of spacer 8, for example made of silicon nitride, and from a second type of spacer 9, for example made of silicon dioxide.

It should be noted that, before the spacers 8 and 9 are formed, an operation to implant dopants in the layer 4 is carried out so as to form extensions 4a and 4b of the source and drain regions.

Figure 4:
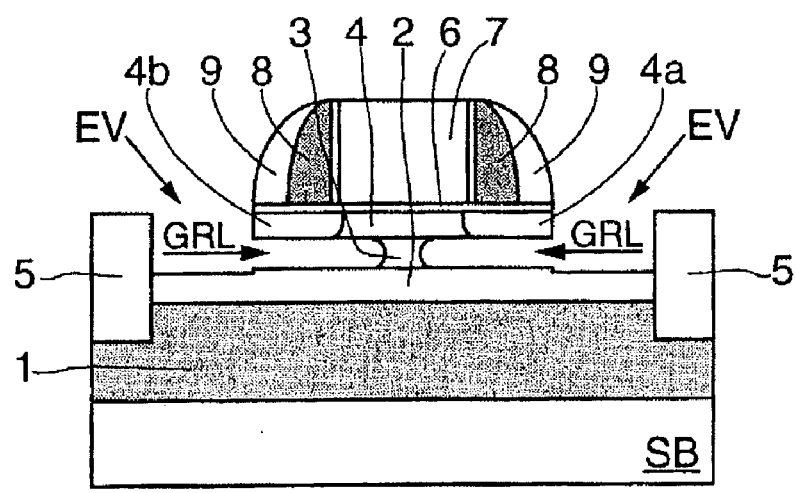

The next step (FIG. 4) comprises removing the interlayer 3.

In this regard, the gate oxide layer 6 (which, although not shown in FIG. 3, also extends over the upper surface of the layer 4 outside the spacers), the second strained silicon layer 4, the interlayer 3 and an upper part of the first layer 2 are etched, for example by means of a plasma, this being done on each side of the spacers 9, so as to form two recesses EV.

The process then continues with lateral selective etching GRL of the rest of the interlayer 3 located under the gate flanked by its spacers. The characteristics of such lateral etching are described in French Patent Application No. 2,791,178 for example.

More specifically, a well-known oxidizing chemistry, such as a solution of 40 ml of 70% $HNO_3$+20 ml of $H_2O_2$+5 ml of 0.5% HF, or else isotropic plasma etching, may be used.

It should be noted here that, although any material that can be selectively removed with respect to silicon may be suitable, $Si_{1-x}Ge_x$ alloys are recommended as they can be easily removed selectively by such an oxidizing chemistry or by isotropic plasma etching.

After this lateral selective etching GRL, a tunnel is formed between the first strained silicon layer 2 and the second strained silicon layer 4.

Figure 5:
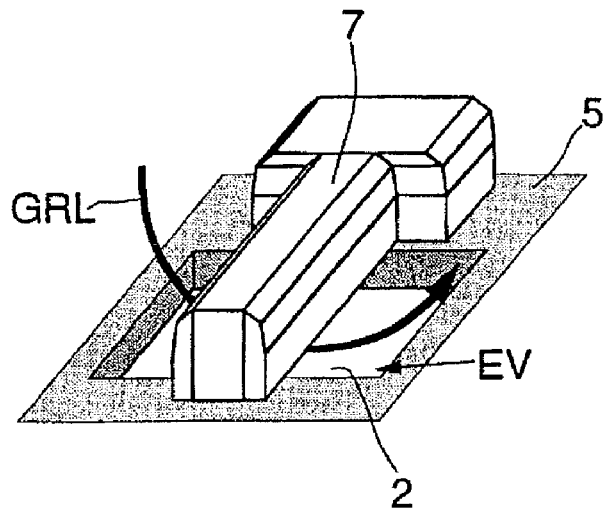

In this regard, it should be noted, as illustrated in FIG. 5, that during the formation of the tunnel the gate is suspended and forms a bridge resting on the edges of the isolating region 5.

Figure 6:
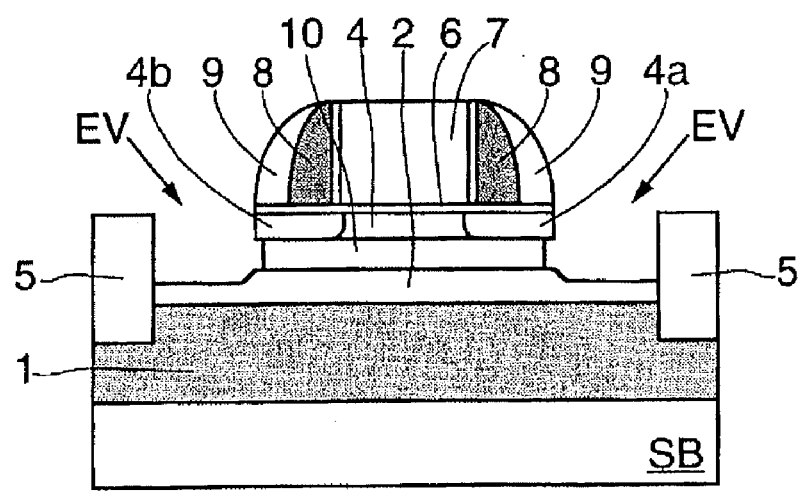

The next step, illustrated in FIG. 6, comprises filling the tunnel with an insulating material 10. In this regard, an oxidation operation may be carried out on the tunnel. More specifically, the insulating layer 10, which may for example be made of silicon dioxide, is obtained by thermal oxidation. The thermal oxide thus formed will not only comprise insulating material 10 filling the tunnel but also a part located in the bottom of the recesses and a part located on the vertical sidewalls of the second strained silicon layer 4.

The process then continues, for example, with isotropic plasma etching so as to remove the insulating oxide layer at the bottom of the recesses EV. It should be noted here that this anisotropic plasma etching does not remove the insulating layer 10 located in the tunnel, since the inside of the tunnel is protected from the plasma etching.

Furthermore, during this operation of removing the insulating material outside the tunnel and of cleaning the recesses, the second spacer 9 disappears, exposing the ends of the channel layer 4. The said ends are thus stripped of any residue of insulating material.

Figure 7:
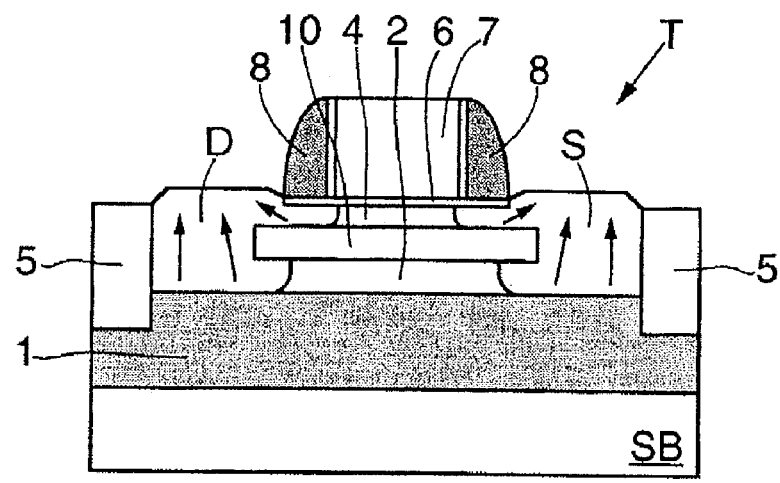

The next step, illustrated in FIG. 7, comprises filling the recesses EV by selective epitaxy of silicon which will furthermore grow on the exposed ends of the layer 4, thus creating the link between the channel region and the source and drain regions.

This selective epitaxy is followed by conventional implantation so as to form the source and drain regions.

The remainder of the transistor production process is conventional and comprises the production of the contact pads on the source, drain and gate regions.

A lightly doped strained-channel transistor is thus obtained, as illustrated in FIG. 7.

This transistor is located on top of the base layer 1, which rests on the semiconductor substrate SB, this base layer being formed from a relaxed silicon-germanium alloy.

Moreover, the transistor includes, under the isolated gate 7, a first strained silicon layer 2 resting on the base layer 1, this strained silicon layer 2 being surmounted by a buried insulating layer 10, surmounted by a second strained silicon layer 4 extending between the source and drain regions, and in which the channel of the transistor is created.

The fineness of the channel layer 4 makes it possible by geometrical means to obtain good control over the short channel effects.

Moreover, the strained, and lightly doped, silicon will allow carriers of greater mobility to be obtained.

The invention is not limited to the method of implementation and the embodiment that have just been described, rather it encompasses all variants thereof.

Figure 8:
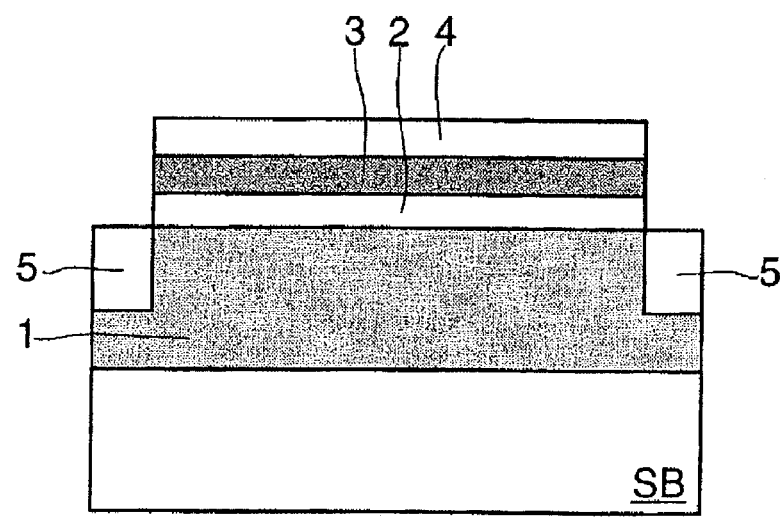
FIG. 8 illustrates schematically another method of implementing the invention.

Thus, as illustrated in FIG. 8, it is possible to produce the isolation zone 5 after the base layer 1 has been formed but before the layer 2, 3 and 4 have been formed. This therefore makes it possible to produce these isolation zones 5 with a conventional thermal budget, without fear of the strained silicon layers relaxing since these layers have not yet been produced.

On the other hand, it will then be necessary to produce the stack of layers 2, 3 and 4 by selective epitaxy, well known to those skilled in the art, so as to grow these layers only on the upper surface of the base layer 1, bounded by the isolation zone 5.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An isolated-gate field-effect transistor integrated circuit wherein the transistor is located on top of a base layer resting on a semiconductor substrate and is formed from a relaxed silicon-germanium alloy, the integrated circuit including, under an isolated gate, a first strained silicon layer resting on the base layer, surmounted by a buried insulating layer, surmounted by a second strained silicon layer having at least a first portion forming a channel region of the transistor extending between source and drain regions of the transistor and wherein separated portions of the second strained silicon layer are doped to form transistor source and drain extensions.

2. The circuit according to claim 1, wherein the thickness of the first strained silicon layer, the second strained silicon layer and the insulating layer is much smaller than that of the base layer.

3. The circuit according to claim 2, wherein the thickness of the first strained silicon layer, the second strained silicon layer and the insulating layer is of the order of a few tens of nanometers.

4. The circuit according to claim 3 wherein the thickness is about 20 nanometers.

5. The circuit according to claim 2, wherein the thickness of the base layer is of the order of a few microns.

6. The circuit according to claim 5 wherein the thickness is about 2 microns.

7. A transistor structure, comprising:
an isolated gate structure;
a pair of strained silicon layers which are insulated from each other and underlie the gate structure, wherein an upper one of the pair of strained silicon layers which are insulated from each other has at least a part of which forming a channel region for the transistor, and wherein portions of the upper one of the pair of strained silicon layers are separated from each other and are doped to form transistor source and drain extensions; and
a base layer which underlies the pair of strained silicon layers.

8. The structure of claim 7 wherein the pair of strained silicon layers are insulated from each other by a silicon dioxide interlayer.

9. The structure of claim 7 wherein the isolated gate structure further includes spacers.

10. The structure of claim 7 wherein the base layer is a silicon-germanium layer grown by epitaxy over a semiconductor substrate.

11. The structure of claim 7 wherein the base layer is substantially thicker than the pair of strained silicon layers which are insulated from each other.

12. The structure of claim 11 wherein the base layer has a thickness in the order of a few microns and the pair of strained silicon layers which are insulated from each other have a thickness in the order of a few tens of nanometers.

13. A field effect transistor, comprising:
a first strained silicon layer at least a part of which comprises a channel region for the transistor and wherein other parts of the first strained silicon layer one either side of the channel region form transistor source and drain extension regions;
a second strained silicon layer positioned below the first strained silicon layer; and
an insulating layer between the first and second strained silicon layers.

14. The transistor of claim 13 further including a base layer underlying the second strained silicon layer.

15. The transistor of claim 14 further including a substrate underlying the base layer.

16. The transistor of claim 13 further including a sacrificial layer positioned between the first and second strained silicon layers, the sacrificial layer being removed and the insulating layer being formed in its place.

17. The transistor of claim 13 further including a gate region overlying the channel region of the first strained silicon layer.

* * * * *